(12) United States Patent
Sakutani

(10) Patent No.: US 10,658,271 B2
(45) Date of Patent: May 19, 2020

(54) DIE PAD INCLUDING PROJECTIONS

(71) Applicant: Mitsubishi Electric Corporation, Tokyo (JP)

(72) Inventor: Kazuhiko Sakutani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/281,524

(22) Filed: Feb. 21, 2019

(65) Prior Publication Data

US 2019/0181073 A1 Jun. 13, 2019

Related U.S. Application Data

(62) Division of application No. 15/648,774, filed on Jul. 13, 2017, now Pat. No. 10,290,563.

(30) Foreign Application Priority Data

Oct. 19, 2016 (JP) .................................. 2016-204875

(51) Int. Cl.
*H01L 23/495* (2006.01)

(52) U.S. Cl.
CPC .. *H01L 23/49503* (2013.01); *H01L 23/49513* (2013.01); *H01L 2224/83385* (2013.01)

(58) Field of Classification Search
CPC ......... H01L 23/49503; H01L 23/49501; H01L 23/49513
See application file for complete search history.

(56) References Cited

U.S. PATENT DOCUMENTS

| | | |
|---|---|---|
| 2009/0152696 A1 | 6/2009 | Dimasacat et al. |
| 2013/0020692 A1 | 1/2013 | Fujisawa |
| 2015/0187687 A1 | 7/2015 | Fujisawa |

FOREIGN PATENT DOCUMENTS

| | | |
|---|---|---|
| CN | 102859687 A | 1/2013 |
| JP | 2001-127233 A | 5/2001 |
| JP | 2003-318350 A | 11/2003 |
| JP | 2007-134394 A | 5/2007 |

(Continued)

OTHER PUBLICATIONS

An Office Action mailed by the Japanese Patent Office dated Jun. 25, 2019, which corresponds to Japanese Patent Application No. 2016-204875 and is related to U.S. Appl. No. 16/281,524; with English translation.

(Continued)

*Primary Examiner* — Hoai V Pham
(74) *Attorney, Agent, or Firm* — Studebaker & Brackett PC

(57) ABSTRACT

The specification discloses a technique for preventing a bonding material from reaching the upper and lower surfaces of a semiconductor chip in bonding the semiconductor chip using the bonding material. A die pad of the technique disclosed in the specification includes the following: a die pad substrate; a first projection disposed on the upper surface of the die pad substrate, the first projection having a pedestal shape; a second projection disposed on the upper surface of the die pad substrate so as to surround at least part of the first projection in a plan view, the second projection having a bank shape; and a third projection disposed on the upper surface of the die pad substrate so as to surround at least part of the second projection in a plan view, the third projection having a bank shape.

8 Claims, 4 Drawing Sheets

(56) References Cited

FOREIGN PATENT DOCUMENTS

| JP | 3170627 U | 9/2011 |
|---|---|---|
| WO | 2011142006 A1 | 11/2011 |

OTHER PUBLICATIONS

An Office Action mailed by the Japanese Patent Office dated Dec. 3, 2019, which corresponds to Japanese Patent Application No. 2016-204875 and is related to U.S. Appl. No. 16/281,524.
An Office Action mailed by the Chinese Patent Office dated Nov. 21, 2019, which corresponds to Chinese Patent Application No. 201710976758.2 and is related to U.S. Appl. No. 16/281,524.

F I G . 1
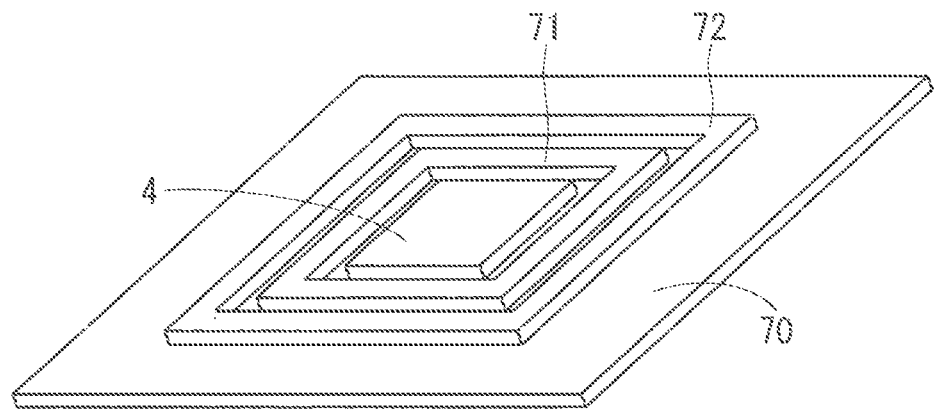
F I G . 2
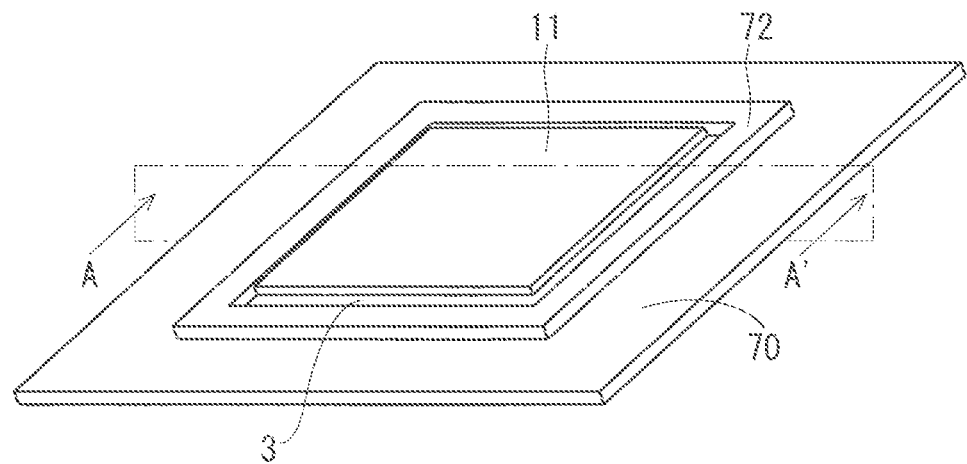

F I G. 3
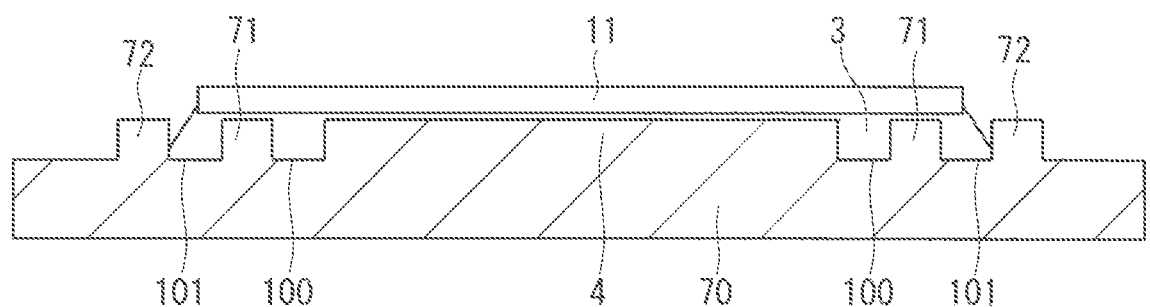
F I G. 4
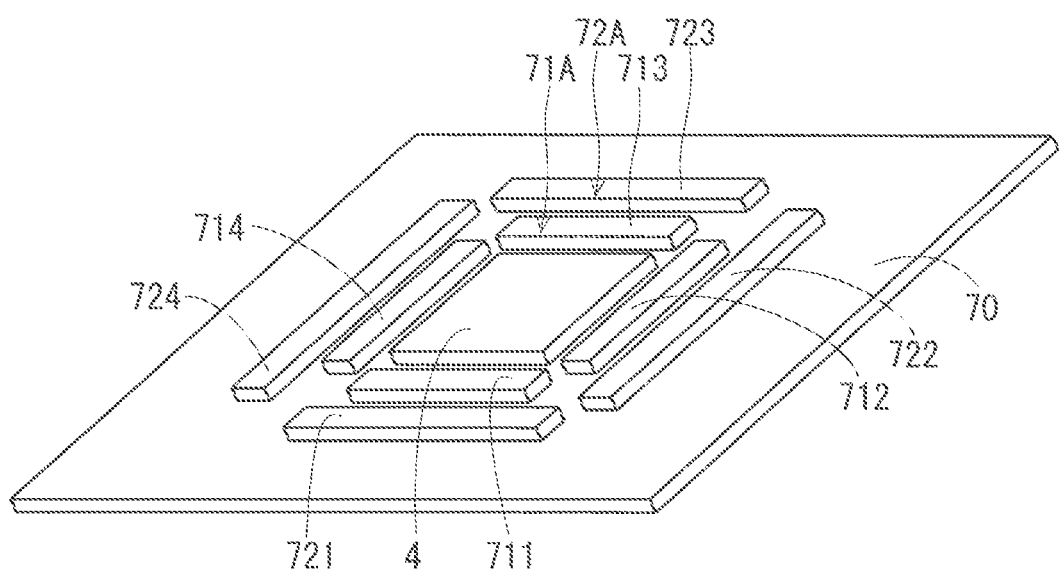

F I G . 5
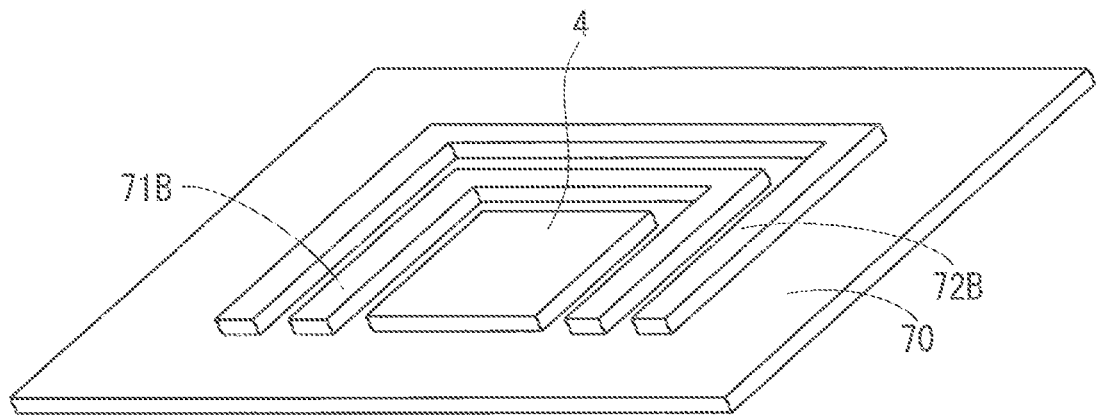
F I G . 6
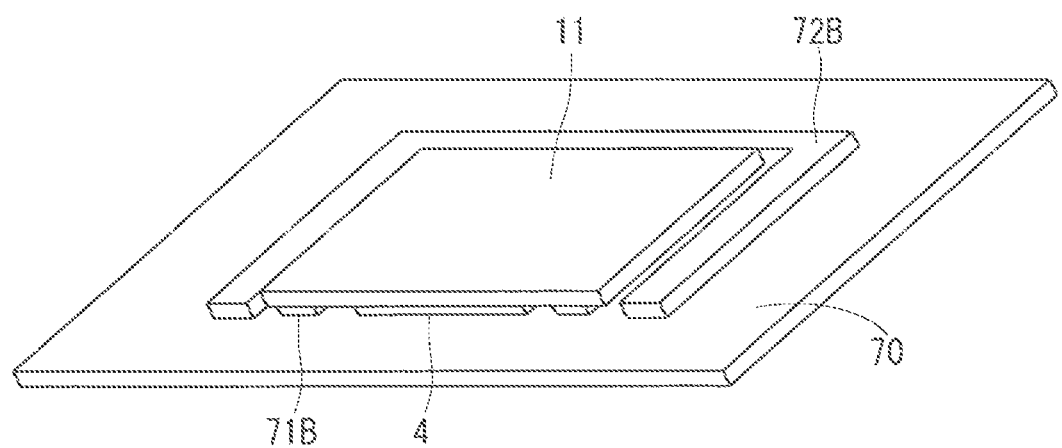

DIE PAD INCLUDING PROJECTIONS

CROSS-REFERENCE TO RELATED APPLICATION

This application is a Continuation of U.S. patent application Ser. No. 15/648,774 filed Jul. 13, 2017, which claims priority to and the benefit of Japanese Patent Application No. 2016-204875 filed Oct. 19, 2016, the entire contents of which are incorporated herein by reference.

BACKGROUND OF THE INVENTION

Field of the Invention

The specification discloses a technique that relates to a die pad, a semiconductor device, and a method for producing the semiconductor device.

Description of the Background Art

In recent years, integrated circuits (ICs) or large-scale integrations (LSIs), for instance, needs to have a high degree of integration. In particular, the semiconductor chips need to be reduced in thickness for their improved stacking capabilities.

Such a reduction in thickness of the semiconductor chips has progressed also in the field of power semiconductors, in order to reduce energy losses (cf. Japanese Patent Application Laid-Open No. 2001-127233). A typical semiconductor chip is bonded, with a bonding material, to the upper surface of a die pad on the upper surface of a lead frame. Alternatively, the semiconductor chip is bonded, with the bonding material, to the upper surface of the die pad on the upper surface of a semiconductor substrate.

When the semiconductor chip is reduced to have a thickness of 200 µm or less for instance, the bonding material extends up to the upper surface of the semiconductor chip to thus possibly cover an electrode on a surface of the semiconductor chip. Further, when the semiconductor chip is reduced to have a thickness of 200 µm or less for instance, the bonding material reaches the upper and lower surfaces of the semiconductor chip to thus possibly cause electrical shorting between the upper and lower surfaces of the semiconductor chip.

SUMMARY

The present invention relates to a technique for preventing a bonding material from reaching the upper and lower surfaces of a semiconductor chip in bonding the semiconductor chip using the bonding material.

A die pad according to a first aspect of the technique disclosed in the specification includes the following: a die pad substrate; a first projection disposed on the upper surface of the die pad substrate, the first projection having a pedestal shape; a second projection disposed on the upper surface of the die pad substrate so as to surround at least part of the first projection in a plan view, the second projection having a bank shape; and a third projection disposed on the upper surface of the die pad substrate so as to surround at least part of the second projection in a plan view, the third projection having a bank shape.

A semiconductor device according to a second aspect of the technique disclosed in the specification includes a die pad, and a semiconductor chip disposed above the upper surface of the die pad through a bonding material. The die pad includes the following: a die pad substrate; a first projection disposed on the upper surface of the die pad substrate, in a region provided with the semiconductor chip, the first projection having a pedestal shape; a second projection disposed on the upper surface of the die pad substrate so as to surround at least part of the first projection in a plan view, the second projection having a bank shape; and a third projection disposed on the upper surface of the die pad substrate so as to surround at least part of the second projection in a plan view, the third projection having a bank shape. The semiconductor chip, which is disposed above the upper surface of the die pad substrate, has an end located above a first groove between the first projection and the second projection, above a second groove between the second projection and the third projection, or above the die pad substrate extending outward from the third projection.

A method for producing a semiconductor device, according to a third aspect of the technique disclosed in the specification includes preparing a die pad, and placing a semiconductor chip above the upper surface of the die pad through a bonding material. The preparation of the die pad includes the following: preparing a die pad substrate; forming a first groove surrounding a partial region onto the upper surface of the die pad substrate to form a first projection having a pedestal shape; forming a second groove surrounding the first groove onto the upper surface of the die pad substrate to form a second projection having a bank shape; and forming a third groove surrounding the second groove onto the upper surface of the die pad substrate to form a third projection having a bank shape. The placement of the semiconductor chip above the upper surface of the die pad substrate through the bonding material includes the following: placing the semiconductor chip above the first projection, which is disposed on the upper surface of the die pad substrate through the bonding material. When the semiconductor chip is placed above the upper surface of the die pad through the bonding material, the semiconductor chip, which is disposed above the upper surface of the die pad substrate, has an end positioned above the first groove, above the second groove, or above the third groove.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic perspective view of a configuration for achieving a die pad, according to a preferred embodiment;

FIG. 2 is a perspective view of a structure in which a semiconductor chip is bonded to the upper surface of the die pad provided with projections, according to the preferred embodiment;

FIG. 3 is a cross-sectional view of the structure taken along the line A-A' in FIG. 2;

FIG. 4 is a perspective view of a structure according to the preferred embodiment in which an individual projection surrounding another projection in a plan view is composed of a plurality of parts spaced apart from each other;

FIG. 5 is a schematic perspective view of a configuration for achieving a die pad according to a preferred embodiment;

FIG. 6 is a perspective view of a structure in which a semiconductor chip is bonded to the upper surface of a die pad provided with projections, according to the preferred embodiment;

DESCRIPTION OF THE PREFERRED EMBODIMENTS

Figure 7:
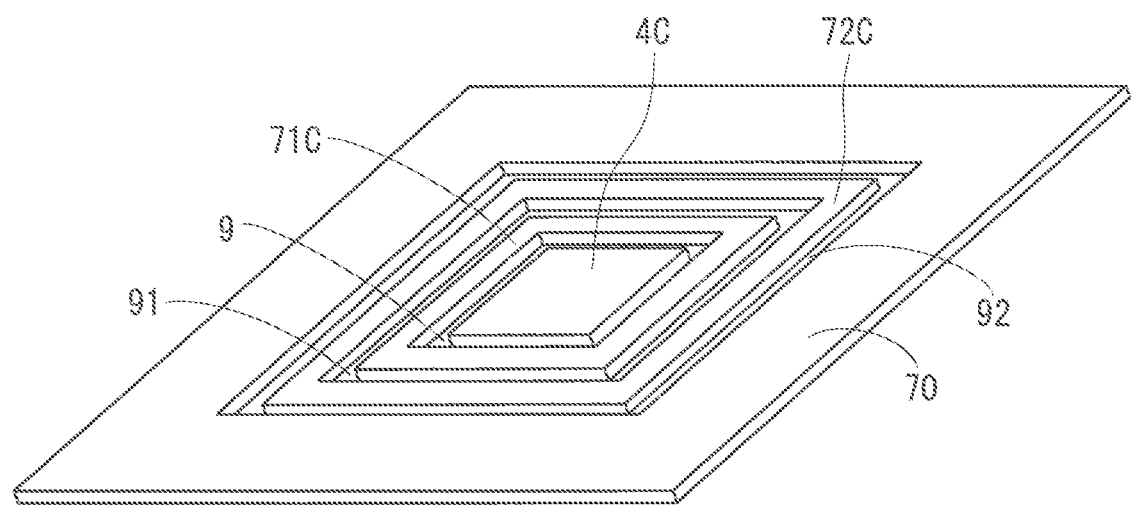
FIG. 7 is a schematic perspective view of a configuration for achieving a die pad according to a preferred embodiment.

The preferred embodiments will be described with reference to the accompanying drawings.

The drawings are schematic, and thus some configurations are not shown or are briefly illustrated for convenience. Further, mutual relationships between the sizes and positions of images that are illustrated in different drawings are not necessarily accurate, and thus can be changed as appropriate.

Throughout the following descriptions, like components are denoted by the same symbols, and are also provided with the same names and the same functions. Hence, detailed descriptions of the like components can be omitted for avoiding repetitions.

Throughout the following descriptions, any terms, such as "top", "under", "left", "right", "side", "bottom", "front", and "back" that indicate specific positions and specific directions, are used for the sake of easy understanding of the preferred embodiments. These terms thus have nothing to do with actual directions when the embodiments are actually implemented.

Throughout the following descriptions, ordinal numbers, such as "first" and "second", if any, are used for the sake of easy understanding of the preferred embodiments. The descriptions are thus not limited to orders resulting from these ordinal numbers.

First Preferred Embodiment

The following describes a die pad, a semiconductor device, and a method for producing the semiconductor device, according to a first preferred embodiment.

<Configuration of Die Pad>

FIG. 1 is a schematic perspective view of a configuration for achieving the die pad according to the first preferred embodiment. In view of easy understanding of the configuration, FIG. 1 may contain omission or simplification of some of the components.

As illustrated in FIG. 1, the die pad includes the following: a die pad substrate 70; a projection 4 disposed on the upper surface of the die pad substrate 70, the projection 4 having a pedestal shape; a projection 71 disposed on the upper surface of the die pad substrate 70 so as to surround the projection 4 in a plan view, the projection 71 having a bank shape; and a projection 72 disposed on the upper surface of the die pad substrate 70 so as to further surround the projection 71 in a plan view, the projection 72 having a bank shape.

The projection 4, the projection 71, and the projection 72 are integrated with the die pad substrate 70. The projection 4, the projection 71, and the projection 72 are also formed by, for example, pressing, etching, or film formation.

Although FIG. 1 illustrates that two projections, which are the projection 71 and the projection 72, surround the projection 4 in a plan view, any number of projections may surround the projection 4 in a plan view. That is, more than two projections may surround the projection 4 in a plan view. Alternatively, a single projection alone may surround the projection 4. The number of projections surrounding the projection 4 in a plan view may be changed in response to requirements for individual semiconductor chips, when the plurality of semiconductor chips are disposed on the upper surface of the die pad substrate 70.

The following description is directed to a semiconductor chip 1, a semiconductor chip 11, and a semiconductor chip 12, where the semiconductor chip 1 has an area enough to cover the projection 4 in a plan view, where the semiconductor chip 11 has an area enough to cover the projection 4 and the projection 71 in a plan view, and where the semiconductor chip 12 has an area enough to cover the projection 4, the projection 71, and the projection 72 in a plan view.

FIG. 2 is a perspective view of a structure in which the semiconductor chip 11 is bonded to the upper surface of the die pad substrate 70 provided with the projection 4, the projection 71, and the projection 72. FIG. 3 is a cross-sectional view of the structure taken along the line A-A' in FIG. 2.

As illustrated in FIGS. 2 and 3, the semiconductor chip 11 is bonded to the upper surface of the die pad substrate 70 through a bonding material 3. The semiconductor chip 11 extends from a region provided with the projection 4 through a region provided with the projection 71.

Although not illustrated in FIGS. 2 and 3, the die pad is disposed on the upper surface of a semiconductor substrate as part of the semiconductor substrate; alternatively, the die pad is disposed on the upper surface of a lead frame as part of the lead frame. The die pad is made of a conductive member.

Bonded to the upper surface of the semiconductor chip 11 is, for example, a conductive wire or a conductive metal material, for establishing electrical conduction.

The semiconductor chip 11 has ends each located above a groove 101 between the projection 71 and the projection 72. In other words, the ends of the semiconductor chip 11 are located beyond the outer periphery of the projection 71.

FIGS. 2 and 3 illustrate that each side of the outer periphery of the projection 71 is shorter than the corresponding side of the semiconductor chip 11. FIGS. 2 and 3 also illustrate that each side of the inner periphery of the projection 72 is longer than the corresponding side of the semiconductor chip 11.

The semiconductor chip 11 is bonded to the projection 4 and the projection 71 through the bonding material 3.

More specifically, a necessary amount of the bonding material 3 is firstly supplied to the upper surface of the individual projections, i.e., the upper surface of the projection 4 and the upper surface of the projection 71, by dispensing and printing.

Subsequently, the semiconductor chip 11 is mounted using a semiconductor-chip mounting apparatus, such as a mounter or a die bonder. At this time, the bonding material 3 is pressed to extend up to the upper surface of each projection by the semiconductor chip 11. The bonding material 3 then reaches the ends of each projection, and then finally falls down to extend to the upper surface of the die pad substrate 70.

The bonding material 3 may be supplied in any manner. Accordingly, the bonding material 3 may be intensively supplied to a single site on the upper surface of the projection 4, or to a single site on the upper surface of the projection 71. Alternatively, the bonding material 3 may be distributed to a plurality of sites.

The bonding material 3 may also be supplied so as to extend across the upper surface of the projection 4 and across the upper surface of the projection 71, provided that the bonding material 3 is supplied so as to always exist inside the semiconductor chip 11 in a plan view.

The projection 4 and the projection 71 sandwich a groove 100. Here, how much and where the bonding material 3 is to be supplied are regulated such that the groove 100 is filled with the bonding material 3 and that the groove 101, which is sandwiched by the projection 71 and the projection 72, is partly but not completely filled with the bonding material 3.

Accordingly, the bonding material 3 as supplied falls down the groove 100 and further down the groove 101 before reaching the ends of the semiconductor chip 11. Consequently, the amount of the bonding material 3 decreases that extends up to the side surfaces of the semiconductor chip 11 and to the upper surface of the semiconductor chip 11, while the amount of the bonding material 3 increases that extends to the upper surface of the die pad substrate 70. This prevents the bonding material 3 from reaching the side surfaces of the semiconductor chip 11 and the upper surface of the semiconductor chip 11.

Although not illustrated in FIGS. 2 and 3, the semiconductor chip 1 has ends each located above the groove 100, which is disposed between the projection 4 and the projection 71. That is, each end of the semiconductor chip 1 is located beyond the corresponding side surface of the projection 4.

Further, although not illustrated in FIGS. 2 and 3, the semiconductor chip 1 is configured such that each side of the outer periphery of the projection 4 is shorter than the corresponding side of the semiconductor chip 1. Further, although not illustrated in FIGS. 2 and 3, the semiconductor chip 1 is configured such that each side of the inner periphery of the projection 71 is longer than the corresponding side of the semiconductor chip 1.

Although not illustrated in FIGS. 2 and 3, the semiconductor chip 12 has ends each located above the die pad substrate 70 extending outward from the projection 72.

Yet further, although not illustrated in FIGS. 2 and 3, the semiconductor chip 12 is configured such that each side of the outer periphery of the projection 72 is shorter than the corresponding side of the semiconductor chip 12.

When the semiconductor chip 1 is bonded, how much and where the bonding material 3 is to be supplied are regulated such that the groove 100 is partly but not completely filled with the bonding material 3.

When the semiconductor chip 12 is bonded, how much and where the bonding material 3 is to be supplied are regulated such that the groove 100 and the groove 101 are filled with the bonding material 3 and that the bonding material 3 falls down the upper surface of the die pad substrate 70 extending outward from the projection 72.

This prevents the bonding material 3 from reaching the side surfaces and upper surface of each semiconductor chip when one of the different-sized semiconductor chip 1, semiconductor chip 11, and semiconductor chip 12, is mounted on the upper surface of the same die pad substrate 70 in conformance with types of semiconductor devices.

At this time, the outer periphery of the projection corresponding to the individual semiconductor chip preferably has sides each shorter than the corresponding side of the semiconductor chip by, for instance, 100 μm or greater, in view of all factors, such as semiconductor-chip mounting accuracy of an apparatus on which a semiconductor chip is to be mounted, variations in cutting a semiconductor substrate into semiconductor chips, and accuracy in forming projections on the upper surface of the die pad substrate 70.

In other words, each side of the projection 4 in a plan view is preferably shorter than the corresponding side of the semiconductor chip 1 by 100 μm or greater. Further, each side of the outer periphery of the projection 71 in a plan view is preferably shorter than the corresponding side of the semiconductor chip 11 by 100 μm or greater. Still further, each side of the outer periphery of the projection 72 in a plan view is preferably shorter than the corresponding side of the semiconductor chip 12 by 100 μm or greater.

Doing so more probably enables the ends of the semiconductor chip to be located beyond the outermost projection.

The aforementioned relationships relating to the lengths reduces conditions in which misalignment between each semiconductor chip and the corresponding projection causes any of the sides of the semiconductor chip not to extend beyond the smaller projection. This prevents the bonding material 3 from reaching the ends of the semiconductor chip before reaching the ends of the projection.

The projection 71 and the projection 72, which surround the projection 4 in a plan view, each do not need to be a single, continuous projection.

FIG. 4 is a perspective view of a structure where the individual projection, which surrounds the projection 4 in a plan view, is composed of a plurality of parts spaced apart from each other.

As illustrated in FIG. 4, the die pad includes the following: the die pad substrate 70; the projection 4 disposed on the upper surface of the die pad substrate 70, the projection 4 having a pedestal shape; a projection 71A disposed on the upper surface of the die pad substrate 70 so as to surround the projection 4 in a plan view; and a projection 72A disposed on the upper surface of the die pad substrate 70 so as to further surround the projection 71A in a plan view.

Here, the projection 71A includes a projection 711, a projection 712, a projection 713, and a projection 714. Further, the projection 72A includes a projection 721, a projection 722, a projection 723, and a projection 724.

Reference is made to the projection 71A. The projection 711 and the projection 713 are disposed in positions facing each other. Further, the projection 712 and the projection 714 are disposed in positions facing each other.

Reference is now made to the projection 72A. The projection 721 and the projection 723 are disposed in positions facing each other. Further, the projection 722 and the projection 724 are disposed in positions facing each other.

At this time, when the semiconductor chip 11 is mounted, for instance, the bonding material 3 that has reached the ends of the projection 71A falls down the groove 100 between the projection 71A and the projection 72A. Here, more amount of the bonding material 3 than appropriate, if any, causes the bonding material 3 to extend up to an upper portion of the projection 72A upon reaching the projection 72A.

However, the projection 72A includes a plurality of projections spaced apart from each other, namely, the projection 721, the projection 722, the projection 723, and the projection 724. Accordingly, the bonding material 3 passes through between these projections of the projection 72A spaced apart from each other to thus leak outside the projection 72A. This prevents the bonding material 3 from extending up to the upper surface of the projection 72A, and further prevents the bonding material 3 from extending up to the side surfaces of the semiconductor chip 11 and the upper surface of the semiconductor chip 11.

The bonding material 3 may be a resin adhesive. Alternatively, the bonding material 3 may be a metal bonding material, such as solder or a sintered material. The use of a conductive bonding material, such as solder, Ag paste, or sintered Ag, allows the first preferred embodiment to apply to a semiconductor device that needs to establish electrical conduction from the upper surface of a semiconductor chip, through the inside of the semiconductor chip, to the lower surface of the semiconductor chip, projections, and further a die pad.

Second Preferred Embodiment

The following describes a die pad, a semiconductor device, and a method for producing the semiconductor device, according to a second preferred embodiment. In the following description, components similar to those described in the aforementioned preferred embodiment are denoted by the same symbols, and the detailed descriptions of the similar components are omitted as necessary.

<Configuration of Die Pad>

FIG. 5 is a schematic perspective view of a configuration for achieving the die pad according to the second preferred embodiment. In view of easy understanding of the configuration, FIG. 5 may contain omission or simplification of some of the components.

As illustrated in FIG. 5, the die pad includes the following: the die pad substrate 70; the projection 4 disposed on the upper surface of the die pad substrate 70, the projection 4 having a pedestal shape; a projection 71B disposed on the upper surface of the die pad substrate 70 so as to partly surround the projection 4 in a plan view; and a projection 72B disposed on the upper surface of the die pad substrate 70 so as to partly surround the projection 71B in a plan view.

The projection 71B is provided to partly surround the projection 4 in a plan view. In other words, the projection 71B does not completely surround the perimeter of the projection 4 in a plan view; that is, the projection 71B has such a shape that its perimeter is partly lacking. If the projection 4 is rectangular in a plan view, the projection 71B is lacking in a site adjacent to the projection 4, facing at least one of the sides of the projection 4 or part of this side, as illustrated in FIG. 5.

The projection 72B is likewise provided to partly surround the projection 4 in a plan view, and is also provided to partly surround the projection 71B in a plan view. In other words, the projection 72B does not completely surround the perimeter of the projection 71B in a plan view; that is, the projection 72B has such a shape that its perimeter is partly lacking. If the projection 71B is rectangular in a plan view, the projection 72B is lacking in a site adjacent to the projection 71B, facing at least one of the sides of the projection 71B or part of this side, as illustrated in FIG. 5.

The semiconductor chip 1, the semiconductor chip 11, or the semiconductor chip 12 is mounted such that one of the sides of the semiconductor chip is located outside one of the four sides of the projection 4. Reference is made to the three remaining sides of each semiconductor chip. For the semiconductor chip 1, the three remaining sides are located outside the projection 4; for the semiconductor chip 11, outside the projection 71B; and for the semiconductor chip 12, outside the projection 72B.

FIG. 6 is a perspective view of a structure in which the semiconductor chip 11 is bonded to the upper surface of the die pad substrate 70 provided with the projection 4, the projection 71B and the projection 72B. It is noted that any number of projections may be provided other than three projections as illustrated in FIG. 6. In some embodiments, further additional projections are provided that partly surround the projection 4 in a plan view. Alternatively, a single projection may be provided that partly surrounds the projection.

For semiconductor chips having difference sizes from each other, such a configuration enables one of the sides of the individual semiconductor chips to be disposed in a common position. That is, one of the sides of each semiconductor chip, the one side having no projection 71B and no projection 72B, is disposed in the same position. This achieves a uniform distance between a specific site and the different-sized semiconductor chips.

Third Preferred Embodiment

The following describes a die pad, a semiconductor device, and a method for producing the semiconductor device, according to a third preferred embodiment. In the following description, components similar to those described in the aforementioned preferred embodiments are denoted by the same symbols, and the detailed descriptions of the similar components are omitted as necessary.

<Method for Forming Projections>

Provided below is a description about a method for forming individual projections disposed on the die pad substrate 70.

Each projection as described in the aforementioned preferred embodiments does not need to be exposed upward from the die pad substrate 70. FIG. 7 is a schematic perspective view of a configuration for achieving the die pad according to the third preferred embodiment. In view of easy understanding of the configuration, FIG. 7 may contain omission or simplification of some of the components.

As illustrated in FIG. 7, the method includes forming an annular groove 9 on the upper surface of the die pad substrate 70 to form a projection 4C having a pedestal shape. The method further includes forming a plurality of grooves: a groove 91; and a groove 92 in the outer periphery of the groove 9 to form a projection 71C having a bank shape and a projection 72C having a bank shape.

At this time, the upper surface of the die pad substrate 70 is flush with the upper surface of the projection 4C before each groove is formed. Each groove is simply required to be formed by pressing or etching. For a lead frame, the formation of each groove can coincide with the shaping of the lead frame; additionally, for a semiconductor substrate, the formation of each groove can coincide with the formation of the die pad. Each projection is thus easily formed.

It is noted that a plurality of grooves may be formed in the outer peripheries of the three remaining sides of the groove, excluding one of the sides thereof, so that the structures as illustrated in FIGS. 5 and 6 can be established to thus provide a limited position for mounting the semiconductor chip.

Fourth Preferred Embodiment

The following describes a die pad, a semiconductor device, and a method for producing the semiconductor device, according to a fourth preferred embodiment. In the following description, components similar to those described in the aforementioned preferred embodiments are denoted by the same symbols, and the detailed descriptions of the similar components are omitted as necessary.

<Configuration of Die Pad>

Figure 8:
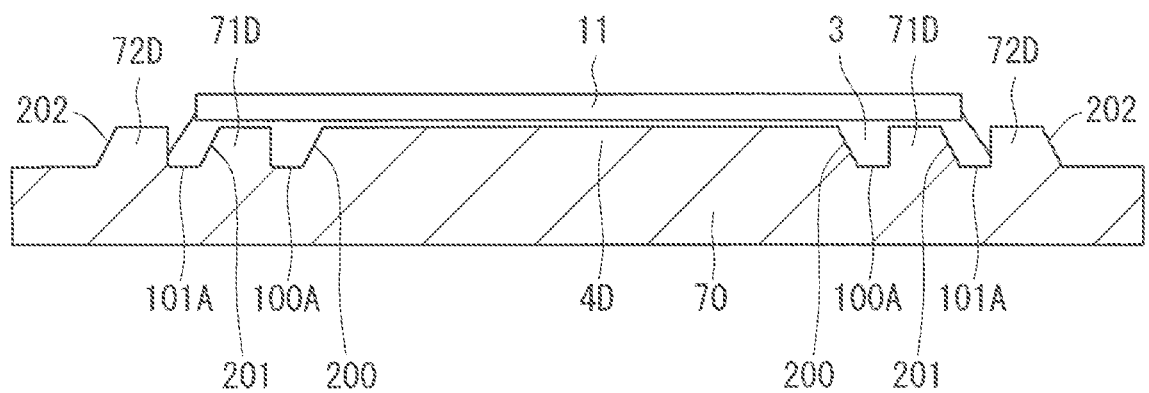
FIG. 8 is a cross-sectional view of a configuration for achieving a die pad according to a preferred embodiment.

FIG. 8 is a schematic cross-sectional view of a configuration for achieving the die pad according to the fourth preferred embodiment. In view of easy understanding of the configuration, FIG. 8 may contain omission or simplification of some of the components.

As illustrated in FIG. 8, the die pad includes the following: the die pad substrate 70; a projection 4D disposed on the upper surface of the die pad substrate 70, the projection 4D having a pedestal shape; a projection 71D disposed on the upper surface of the die pad substrate 70 so as to surround the projection 4D in a plan view, the projection 71D having a bank shape; and a projection 72D disposed on the upper surface of the die pad substrate 70 so as to further surround the projection 71D in a plan view, the projection 72D having a bank shape.

As illustrated in FIG. 8, the projection 4D is provided with side surfaces each having an inclined shape 200 that extends outward toward a lower position of the projection 4D, i.e., so as to extend outward from the upper surface of the projection 4D toward the bottom surface of a groove 100A. As illustrated in FIG. 8, the projection 71D is provided with an outer peripheral surface having an inclined shape 201 that extends outward toward a lower position of the projection 71D, i.e., extends outward from the upper surface of the projection 71D toward the bottom surface of a groove 101A. As illustrated in FIG. 8, the projection 72D is provided with an outer peripheral surface having an inclined shape 202 that extends outward toward a lower position of the projection 72D, i.e., extends outward from the upper surface of the projection 72D toward the upper surface of the die pad substrate 70, adjacent to the outer periphery of the projection 72D.

Accordingly, the bonding material 3 falls down the grooves between the projections along the inclines. Thus, the bonding material 3 is stably distributed to corners formed by each projection and the die pad substrate 70, i.e., corners on the bottom surface of each groove.

When the semiconductor chip 11 is bonded for instance, the bonding material 3, which is supplied to the upper surface of the projection 4D, extends along the inclined shape 200. The bonding material 3 then extends to internal corners of the groove 100A, and further to external corners of the groove 100A.

The bonding material 3 then reaches the upper surface of the projection 71D, and further extends along the inclined shape 201. The bonding material 3 then extends to internal corners of the groove 101A, and further to external corners of the groove 101A.

When the semiconductor chip 12 is bonded, the bonding material 3 reaches the upper surface of the projection 72D and further extends along the inclined shape 202. The bonding material 3 then extends to external corners of the projection 72D.

This reduces air-bubbles at the internal corners and external corners of the groove, and further at the external corners of the projection 72D. This prevents the bonding material 3 from reaching the upper surface of the semiconductor chip and the side surfaces of the semiconductor chip, and further maintains uniform bonding quality.

<Effects of Aforementioned Preferred Embodiments>

The following describes effects of the aforementioned preferred embodiments. Although these effects are based on specific configurations that are illustrated in the above-described preferred embodiments, to an extent that like effects are obtained, these specific configurations may be replaced with different specific embodiments that are illustrated in the specification.

The replacement may be done over several preferred embodiments. That is, combinations of the individual configurations, which are illustrated in the different preferred embodiments, may bring like effects.

In the aforementioned preferred embodiment, the die pad includes the die pad substrate 70, a first projection having a pedestal shape, a second projection having a bank shape, and a third projection having a bank shape. The first projection, which has a pedestal shape, is disposed on the upper surface of the die pad substrate 70. The second projection is disposed on the upper surface of the die pad substrate 70 so as to surround at least part of the first projection in a plan view. The third projection is disposed on the upper surface of the die pad substrate 70 so as to surround at least part of the second projection in a plan view. Here, the first projection corresponds to, for instance, the projection 4; the second projection, to the projection 71; and the third projection, to the projection 72.

By virtues of such a configuration, the grooves between the projections on the upper surface of the die pad substrate 70 are filled with the bonding material 3, or the bonding material 3 leaks out to the upper surface of the die pad substrate 70 extending outward from the projection of the die pad substrate 70, when the semiconductor chip is bonded using the bonding material 3. This prevents the bonding material 3 from reaching the upper or lower surface of the semiconductor chip. In addition, such a configuration, in which the plurality of grooves are provided, is applicable to semiconductor chips having different sizes from each other.

It is noted that different configurations illustrated in the specification, other than the above configurations may be omitted as necessary. That is, at least the above configurations alone bring the above-described effects.

However, the above configurations can additionally include at least one of the different configurations illustrated in the specification as necessary; that is, the above configurations can additionally include the different configurations illustrated in the present specification, which are excluded from these configurations. Such additionally included configurations still bring the above-described effects.

In the aforementioned preferred embodiment, the projection 71A includes a plurality of projections arranged at intervals in a circumferential direction of the projection 71A. Such a configuration enables the bonding material 3 to leak outward from gaps in the circumferential direction of the projection 71A. This effectively prevents the bonding material 3 from reaching the upper surface of the semiconductor chip, or effectively prevents the bonding material 3 from reaching the lower surface of the semiconductor chip.

In the aforementioned preferred embodiment, the projection 72A includes a plurality of projections arranged at intervals in a circumferential direction of the projection 72A. Such a configuration enables the bonding material 3 to leak outward from gaps in the circumferential direction of the projection 72A. This effectively prevents the bonding material 3 from reaching the upper surface of the semiconductor chip, or effectively prevents the bonding material 3 from reaching the lower surface of the semiconductor chip.

In the aforementioned preferred embodiment, the projection 71B is provided to partly surround the projection 4 in a plan view. By virtue of such a configuration, the grooves between the projections on the upper surface of the die pad substrate 70 are filled with the bonding material 3, or the bonding material 3 leaks out to the upper surface of the die pad substrate 70 extending outward from the projection of the die pad substrate 70. This prevents the bonding material 3 from reaching the upper surface or lower surface of the semiconductor chip.

In the aforementioned preferred embodiment, the projection 72B is provided to partly surround the projection 71B in a plan view. By virtue of such a configuration, the grooves between the projections on the upper surface of the die pad substrate 70 are filled with the bonding material 3, or the bonding material 3 leaks out to the upper surface of the die pad substrate 70 extending outward from the projection of the die pad substrate 70. This prevents the bonding material 3 from reaching the upper surface or lower surface of the semiconductor chip. In addition, the projection 71B and the projection 72B may be provided so as not to surround the same one of the sides of the semiconductor chip. If semiconductor chips having different sizes from each other are provided, one of the sides of each semiconductor chip, not surrounded by the projection 71B and the projection 72B, would be disposed in the same position. This enables a uniform distance between a specific site and each of the different-sized semiconductor chips. A wire, for instance, can be used for establishing a connection of the semiconductor chip. In this case, the semiconductor chip is disposed so as to be close to one of the ends of the wire, remote from the semiconductor chip. This enables the wire to be short.

In the aforementioned preferred embodiment, the projection 4D is provided with side surfaces each having the inclined shape 200 that extends outward from the upper surface of the projection 4D toward the upper surface of the die pad substrate 70, adjacent to the outer periphery of the projection 4D. In such a configuration, the bonding material 3, which is supplied to the upper surface of the projection 4D, extends along the inclined shape 200 when the semiconductor chip 11 is bonded. The bonding material 3 then extends to the internal corners of the groove 100A, and further to the external corners of the groove 100A. This reduces the following situation: the bonding material 3 leaks out of the upper surface of the projection 4D to extend across the groove 100A; and at this time, air-bubbles are generated at the internal corners of the groove 100A and further at the external corners of the groove 100A.

In the aforementioned preferred embodiment, the projection 71D is provided with side surfaces each having the inclined shape 201 that extends outward from the upper surface of the projection 71D toward the upper surface of the die pad substrate 70, adjacent to the outer periphery of the projection 71D. In such a configuration, the bonding material 3, which is supplied to the upper surface of the projection 4D, extends along the inclined shape 201 via the upper surface of the projection 71D when the semiconductor chip 11 is bonded. The bonding material 3 then extends to the internal corners of the groove 101A and further to the external corners of the groove 101A. This reduces the following situation: the bonding material 3 leaks out of the upper surface of the projection 71D to extend across the groove 101A; and at this time, air-bubbles are generated at the internal corners of the groove 101A and further at the external corners of the groove 101A.

In the aforementioned preferred embodiment, the projection 72D is provided with side surfaces each having the inclined shape 202 that extends outward from the upper surface of the projection 72D toward the upper surface of the die pad substrate 70, adjacent to the outer periphery of the projection 72D. In such a configuration, the bonding material 3 reaches the upper surface of the projection 72D, and then further extends along the inclined shape 202, when the semiconductor chip 12 is bonded. The bonding material 3 then extends to the external corners of the projection 72D. This reduces the following situation: the bonding material 3 leaks out of the upper surface of the projection 72D to extend to the outer periphery of the projection 72D; and at this time, air-bubbles are generated at the external corners of the projection 72D.

In the aforementioned preferred embodiment, the semiconductor device includes the die pad and the semiconductor chip 11. The semiconductor chip 11 is disposed above the upper surface of the die pad through the bonding material 3. The die pad includes the die pad substrate 70, the projection 4 having a pedestal shape, the projection 71 having a bank shape, and the projection 72 having a bank shape. The projection 4, which has a pedestal shape, is disposed on the upper surface of the die pad substrate 70, in a region provided with the semiconductor chip 11. The projection 71, which has a bank shape, is disposed on the upper surface of the die pad substrate 70 so as to surround at least part of the projection 4 in a plan view. The projection 72, which has a bank shape, is disposed on the upper surface of the die pad substrate 70 so as to surround at least part of the projection 71 in a plan view. The semiconductor chip 11, which is disposed above the upper surface of the die pad substrate 70, has ends each located above a first groove between the projection 4 and the projection 7, above a second groove between the projection 71 and the projection 72, or above the die pad substrate 70 extending outward from the projection 72. Here, the first groove corresponds to, for instance, the groove 100. Further, the second groove corresponds to, for instance, the groove 101.

In such a configuration, the grooves on the upper surface of the die pad substrate 70 are filled with the bonding material 3, or the bonding material 3 leaks out to the upper surface of the die pad substrate 70 extending outward from the projection of the die pad substrate 70, when the semiconductor chip is bonded using the bonding material. This prevents the bonding material 3 from reaching the upper surface or lower surface of the semiconductor chip. Such a configuration, in which the plurality of grooves are provided, is applicable to semiconductor chips having different sized from each other.

It is noted that different configurations illustrated in the specification, other than the above configurations may be omitted as necessary. That is, at least the above configurations alone bring the above-described effects.

However, the above configurations can additionally include at least one of the different configurations illustrated in the specification as necessary; that is, the above configurations can additionally include the different configurations illustrated in the present specification, which are excluded from these configurations. Such additionally included configurations still bring the above-described effects.

In the aforementioned preferred embodiment, each end of the semiconductor chip 1 is located above the groove 100, the semiconductor chip 1 has a width greater than a width of a region provided with the projection 4 by 100 µm or greater. Further, each end of the semiconductor chip 11 is located above the groove 101, the semiconductor chip 11 has a width greater than a width of a region provided with the projection 71 by 100 µm or greater. Still further, when each end of the semiconductor chip 12 is located above the die pad substrate 70 extending outward from the projection 72, the semiconductor chip 12 has a width greater than a width of a region provided with the projection 72 by 100 µm or greater. Such a configuration would prevent the bonding material 3 from reaching the upper surface of the semiconductor chip or the lower surface of the semiconductor chip if variations, such as a tolerance in processing a typical semiconductor chip, a tolerance in processing a typical lead frame, and accuracy in mounting the semiconductor chip are reflected.

In the aforementioned preferred embodiment, the bonding material 3 is conductive. In such a configuration, the use of a conductive material, such as solder, Ag paste, or sintered silver, as the bonding material 3 allows the die pad according to the preferred embodiment to be used for a semiconductor device that needs to establish electrical conduction between a bonding surface of a semiconductor chip and the die pad.

In the aforementioned preferred embodiment, a method for producing a semiconductor device includes preparing a die pad, and placing a semiconductor chip above the upper surface of the die pad through the bonding material 3. Here, the step of preparing the die pad includes the following: preparing the die pad substrate 70; forming the groove 9 surrounding a partial region onto the upper surface of the die pad substrate 70 to form a first projection having a pedestal shape; forming the groove 91 surrounding the groove 9 onto the upper surface of the die pad substrate 70 to form a second projection having a bank shape; and forming a third groove surrounding the groove 91 onto the upper surface of the die pad substrate 70 to form a third projection having a bank shape. Here, the third groove corresponds to, for instance, the groove 92. Further, the first projection corresponds to, for instance, the projection 4C. Still further, the second projection corresponds to, for instance, the projection 71C. Yet further, the third projection corresponds to, for instance, the projection 72C. The step of placing the semiconductor chip above the upper surface of the die pad through the bonding material 3 includes placing the semiconductor chip 11 in a region surrounded by the groove 9, which is disposed on the upper surface of the die pad substrate 70, through the bonding material 3. When the semiconductor chip is placed above the upper surface of the die pad through the bonding material 3, the semiconductor chip 11, which is disposed above the upper surface of the die pad substrate 70, has ends each positioned above the groove 9, above the groove 91, or above the groove 92.

In such a configuration, the grooves, which are disposed on the upper surface of the die pad substrate 70, are filled with the bonding material 3, or the bonding material 3 leaks out to the upper surface of the die pad substrate 70 extending outward from the projections of the die pad substrate 70, when the semiconductor chip is bonded using the bonding material 3. This prevents the bonding material 3 from reaching the upper surface of lower surface of the semiconductor chip. In addition, the upper surface of the die pad substrate 70 undergoes processing, such as pressing or etching to form the groove 9, the groove 91, and further the groove 92. This facilitates the production of the semiconductor device according to the preferred embodiment. In addition, this configuration, in which the plurality of grooves are formed, is applicable to semiconductor chips having different sizes from each other.

It is noted that different configurations illustrated in the specification, other than the above configurations may be omitted as necessary. That is, at least the above configurations alone bring the above-described effects.

However, the above configurations can additionally include at least one of the different configurations illustrated in the specification as necessary; that is, the above configurations can additionally include the different configurations illustrated in the present specification, which are excluded from these configurations. Such additionally included configurations still bring the above-described effects.

The order of the individual process steps can be changed unless otherwise specifically limited.

<Modifications of Aforementioned Preferred Embodiments>

The material quality, material, size, and shape of each component, the positions of components relative to each other, and conditions for implementation, described in each of the aforementioned preferred embodiments are illustrative in all aspects. Thus, they are not limited to what are described in the present invention.

Accordingly, numerous variations not shown can be assumed within the range of the technique disclosed in the specification. Examples of the variations include the modification, addition and omission of at least one component. Another example is extracting at least one component from at least one of the preferred embodiments and then combining the extracted component with another component of a different preferred embodiment.

Unless otherwise contradicted, "one" component described in each of the preferred embodiments may include "one or more" components.

Individual components are conceptual units. Thus, within the technique disclosed in the specification, one component may include multiple structures, one component may correspond to a part of some structure, and multiple components may be included in one structure.

Each component includes a structure of a different configuration or a different shape as long as the structure of the different configuration or the different shape achieves the same function.

The descriptions in the present specification are referred for all purposes regarding the present technique. It is thus not an admission that any of the descriptions provided herein are conventional techniques.

If the aforementioned preferred embodiments contain descriptions about materials without being particularly specified, it is to be understood that an example of these materials is an alloy containing other additives within these materials unless otherwise contradicted.

While the invention has been shown and described in detail, the foregoing description is in all aspects illustrative and not restrictive. It is therefore understood that numerous modifications and variations can be devised without departing from the scope of the invention.

What is claimed is:

1. A die pad comprising:
a die pad substrate;
a first projection disposed on an upper surface of said die pad substrate, said first projection having a pedestal shape;
a second projection disposed on said upper surface of said die pad substrate so as to surround at least part of said first projection in a plan view, said second projection having a bank shape; and
a third projection disposed on said upper surface of said die pad substrate so as to surround at least part of said second projection in a plan view, said third projection having a bank shape, wherein
said second projection includes a side that extends longitudinally in a direction substantially parallel to a direction in which a side of said first projection extends longitudinally, and said third projection includes a side that extends longitudinally in a direction substantially parallel to said direction in which said side of said second projection extends longitudinally,
a first length along said longitudinal direction of said side of said second projection is greater than a second length along said longitudinal direction of said side of said first projection, and
a third length along said longitudinal direction of said side of said third projection is greater than said first length along said longitudinal direction of said side of said second projection.

2. The die pad according to claim 1, wherein said second projection comprises a plurality of parts spaced apart from each other in a circumferential direction thereof.

3. The die pad according to claim 1, wherein said third projection comprises a plurality of parts spaced apart from each other in a circumferential direction thereof.

4. The die pad according to claim 1, wherein said second projection is provided to partly surround said first projection in a plan view.

5. The die pad according to claim 1, wherein said third projection is provided to partly surround said second projection in a plan view.

6. The die pad according to claim 1, wherein said first projection comprises a side surface having an inclined shape that extends outward from an upper surface of said first projection toward said upper surface of said die pad substrate, adjacent to an outer periphery of said first projection.

7. The die pad according to claim 1, wherein said second projection comprises a side surface having an inclined shape that extends outward from an upper surface of said second projection toward said upper surface of said die pad substrate, adjacent to an outer periphery of said second projection.

8. The die pad according to claim 1, wherein said third projection comprises a side surface having an inclined shape that extends outward from an upper surface of said third projection toward said upper surface of said die pad substrate, adjacent to an outer periphery of said third projection.

* * * * *